United States Patent [19]

Roch

[11] 4,056,777
[45] Nov. 1, 1977

[54] MICROCIRCUIT TEST DEVICE WITH MULTI-AXES PROBE CONTROL

[75] Inventor: Jacques Leon Roch, San Jose, Calif.
[73] Assignee: Electroglas, Inc., Santa Clara, Calif.
[21] Appl. No.: 696,512
[22] Filed: June 16, 1976

Related U.S. Application Data

[60] Continuation of Ser. No. 497,471, Aug. 14, 1974, which is a division of Ser. No. 366,421, June 4, 1973, Pat. No. 3,851,249.

[51] Int. Cl.² .................. G01R 31/02; G01R 1/06
[52] U.S. Cl. .................. 324/158 P; 324/72.5; 324/158 F
[58] Field of Search .............. 324/158 P, 158 F, 72.5

[56] References Cited

U.S. PATENT DOCUMENTS

| | | | |
|---|---|---|---|
| 3,551,807 | 12/1970 | Kulischenko et al. | 324/158 P |
| 3,599,093 | 8/1971 | Oates | 324/158 P |
| 3,741,022 | 6/1973 | Olson et al. | 324/158 P |

*Primary Examiner*—Rudolph V. Rolinec
*Assistant Examiner*—Ernest F. Karlsen
*Attorney, Agent, or Firm*—Ellsworth R. Roston

[57] ABSTRACT

A tool for testing the miniaturized circuitry of silicone wafer devices. A ring-shaped structure is supported on a casting or platform for movement along X and Z axes in a horizontal plane. A probe is suspended from the ring-shaped element for contact with a lead-in point of the circuitry on the device to be tested. The probe may be moved along the X and Z horizontal axes and a Y vertical axis relative to the ring, movement in the X and Z axes being controlled by a single lever which acts between the ring and the probe. Movement of the probe in the Y axis is controlled by a screw-type pressure-exerting device which also serves as a pivot point for movement of the probe along the horizontal axes. A high performance board is supported on the ring to act as a junction board so that the probes may be connected to a cable which runs around the ring. The cable extends radially therefrom at a location such that it may be connected to suitable external control circuitry.

22 Claims, 5 Drawing Figures

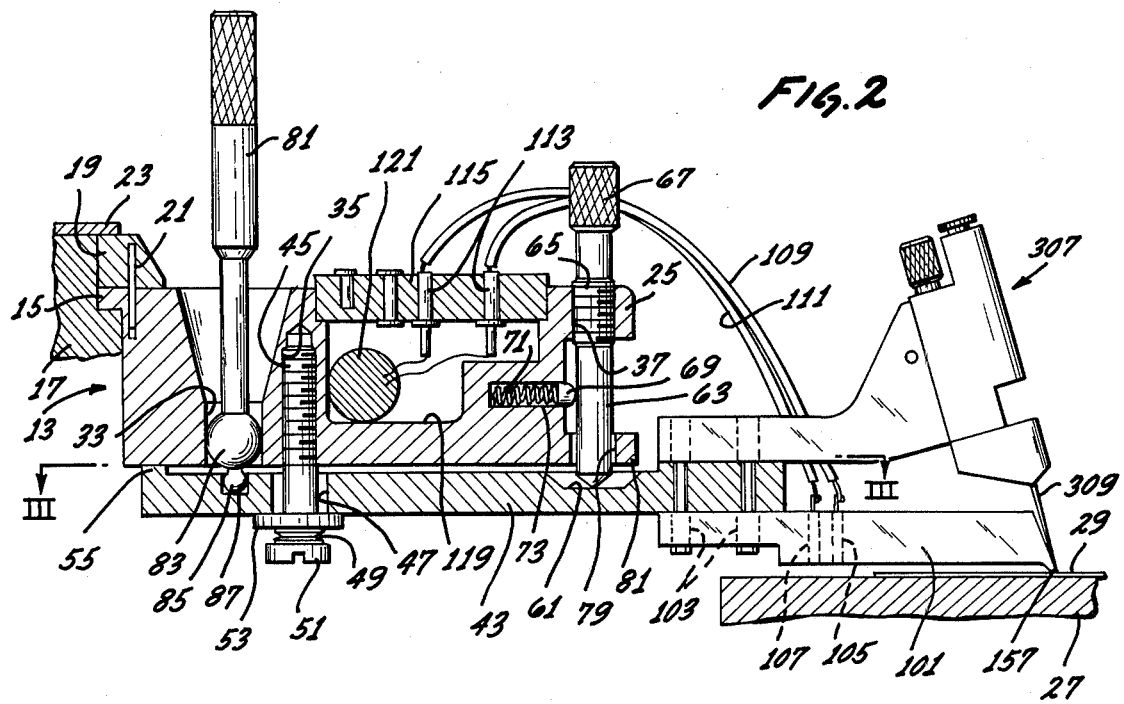
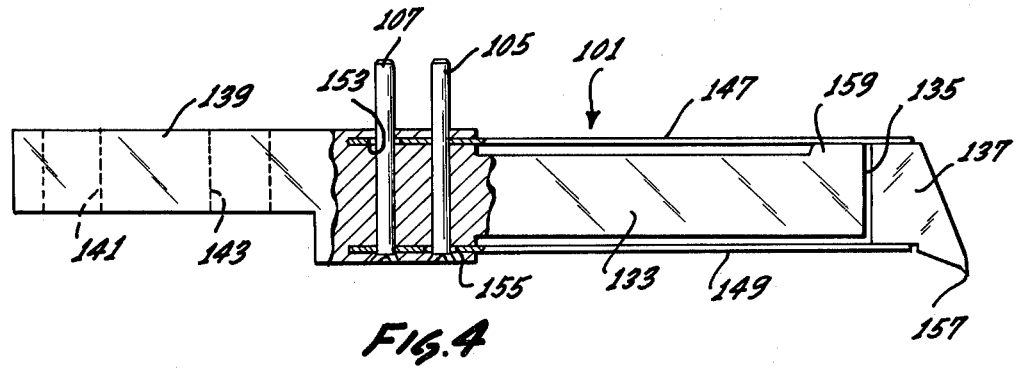
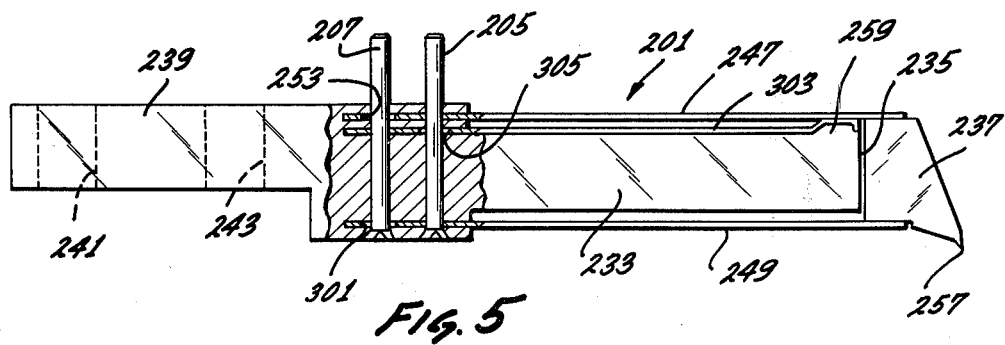

MICROCIRCUIT TEST DEVICE WITH MULTI-AXES PROBE CONTROL

This is a continuation of application Ser. No. 497,471 filed Aug. 14, 1974, which in turn was a division of application Ser. No. 366,421 filed June 4, 1973 (now U.S. Pat. No. 3,851,249 issued Nov. 26, 1974).

BACKGROUND OF THE INVENTION

In the current art of electronic control circuitry, wafers are formed of thin semiconductor slices upon which matrices of microcircuits can be fabricated, or which can be diced into individual circuit units for fabricating transistors and diodes. Since each unit contains its own microcircuit which will be placed into a combination of circuits to accomplish a desired result, it is preferred that each microcircuit be carefully tested before dicing of the semiconductor wafer in order to prevent malformed or malfunctioning circuitry from being employed.

In many cases, the microcircuits each have a plurality of input-output leads or contact points which will be utilized in the finished product. These points can also be used to test the circuitry if one probe can be accurately located on each preselected contact point. Obviously, it is quite a bit easier to test each circuit before the wafer is diced since each circuit will be properly oriented relative to the matrix pattern on the wafer. Accordingly, it has become known to put the wafer on a movable platform or worktable which may be moved relative to a plurality of identical microcircuits, the probes need be oriented relative to only one circuit and fixed in position. Then, the wafer can be moved from position to position so that each microcircuit is properly located relative to the probes for testing.

Unfortunately, the prior art devices have been rather difficult to assemble and have been unsatisfactory in use. Some prior art probes have been manufactured as a relatively flat, vertically oriented blade, a point of which can be placed in contact with an input/output connection of the microcircuit. These blades are quite stiff and must be positioned relative to the wafer with extreme accuracy. Otherwise, either the wafer or the blade will be damaged, since there is little or no flexibility in the vertically oriented blade.

Other probes have been prepared from wires which do have flexibility but which produce excessive contact resistance, can be easily bent out of a usuable position, etc.

In any case, the plurality of probes have been mounted upon a ring which is removably positioned within a bore formed in a casting or platform. Each probe is electrically connected to a high performance board which functions to connect the electrical probe leads to external circuitry, such as a computer-driven power device. These rings have to be completely removed from the casting in which they are seated in order to perform any operation upon the wiring connecting the probe to the high performance board mounted in the ring.

In other words, the construction of the prior art devices has been such that it is extremely difficult to assemble, maintain, and/or repair the probes and the wiring system connecting the probes to the high performance board mounted in the ring. Also, the probes have been highly susceptible to being damaged or damaging the circuitry by being positioned improperly.

Accordingly, it is an object of the present invention to provide an apparatus for testing the circuitry of silicone wafer devices in a manner which precludes damage to the wafers or the probes and which allows the probes to be quickly and easily serviced during construction of the ring or during maintenance. Ideally, the apparatus should be constructed in such a manner that the worktable upon which the silicone wafer is mounted can be controlled in its movement by a computer which will move the table in steps so that the individual circuits are serially presented by rows and columns to a plurality of probes mounted on the ring for testing.

SUMMARY OF THE INVENTION

This invention relates to an improved test probe and an apparatus for positioning a plurality of such probes in predetermined positions. With such apparatus, a plurality of microcircuits formed on a single wafer may be tested serially by moving the wafer relative to the probes so that the microcircuits are positioned serially in one location.

In accordance with the present invention, each probe may be comprised of a dielectric or nonconductive material upon which a vertical blade, ending in a point, may be mounted. The blade may be oriented vertically so that the microcircuits may be positioned below the probes. To mount it vertically, it may be fastened to the dielectric by means of a pair of horizontal spring members which, like the blade, are produced from an electrically conductive material. The spring members, in turn, may be suitably connected to electrical lead-in connectors in order to transmit a suitable current through the spring members and the blade when testing the microcircuits. Since the spring members are mounted in horizontal planes, when the wafer is located below the probes and is brought up thereagainst, if the probes are not absolutely accurately positioned, i.e., they extend below the plane into which the wafer is elevated for testing, there will be no damage to the wafer itself or to the probe. The horizontal spring members will allow a slight degree of movement of the blade along the vertical axis, thereby preventing upward movement of the wafer from generating an excessive force between the microcircuit and the blade which could damage either or both of them.

If desired, certain probes may be provided with a suitable spring contact member. When the edge of the wafer is reached, a signal may be generated by this member which is transmitted to the controlling computer, thereby controlling the position of the fixture upon which the wafer is mounted. When this occurs, the fixture may be automatically actuated to align another column or row of microcircuits for serial movement across the testing location.

Each probe, whether a circuit tester or an edge sensor, may be fixed to a suitable probe arm which, in turn, may be movably mounted upon a ring-like member. The probe arm may be spring-biased into contact with the ring-like member (which shall hereinafter be simply referred to as a ring) in such a manner as to be movable relative thereto. The probe may be adjusted along a vertical axis by means of a screw member which is threadably mounted in the ring. The screw may cooperate with an elongated slot in the probe arm to force the arm downwardly against the force of a spring when the blade is to be lowered to a predetermined height. When the screw is backed off, of course, the spring-bias force will cause the probe to move upwardly with the screw.

The center of the vertical arc through which the probe may thus be moved may be located near the rear end of the probe arm which is held in contact with the undersurface of the ring at a pair of pressure points or nibs which create minimal friction in their contact with the ring.

On the other hand, the probe arm may be moved in either the X or Z axis of the horizontal plane by means of a universal pivot rod which is freely movable within a closely fitting predrilled bore in the ring and extends into a blind bore in the rear end of the probe arm. With this structure, the probe arm may be moved in the horizontal plane without any interference from the vertical adjustment screw which extends the slot in the arm. In this manner, the probe arm can be adjusted along any of three axes and will be fixedly retained in the adjusted position by means of the spring-biasing force which holds the arm against the ring.

Thus, by these means, the applicant has devised a new and improved apparatus for testing silicone wafers. Each wafer can be placed upon a fixture or movable base member which may be moved in steps relative to a plurality of probes. Each probe may be programmed to contact a single point on one of the many microcircuits on the wafer so as to conduct a test of the microcircuit by passing a current or series of currents therethrough. Movement of the base or fixture in the predetermined steps can be automatically accomplished by means of a computer-driven system. Also, the edge of the wafer may be sensed by means of a special probe so that movement of the wafer in another direction can be accomplished. Each of the probes may be positioned relative to the mounting ring in the X, Y, and Z axes by rather simple controls which allow easy access to the wiring system by means of which the probes are powered to test each circuit.

Of course it will be realized that the invention is not to be deemed to be limited to the specific construction shown and described in this application. Rather, the invention, which is defined solely by the appended claims, should be considered to be merely illustrated by the device shown and described. Other embodiments and modifications of this invention will become apparent to those skilled in the art upon reading the following Detailed Description. Such embodiments and modifications are, of course, fully within the scope of the invention as defined by the claims.

BRIEF DESCRIPTION OF THE DRAWINGS

FIG. 2 comprises an illustration of a vertical section of the ring and a probe arm mounted thereon, as would be seen along a line II-II of FIG. 1, realizing that probe arms have not been illustrated in FIG. 1;

FIG. 4 comprises a side elevation, partly in section, of a preferred embodiment of a probe which may be utilized with the present invention; and FIG. 5 comprises a similar illustration of a preferred embodiment of an edge-sensing probe which may be utilized to detect the edge of the silicone wafer.

DETAILED DESCRIPTION

Figure 1:
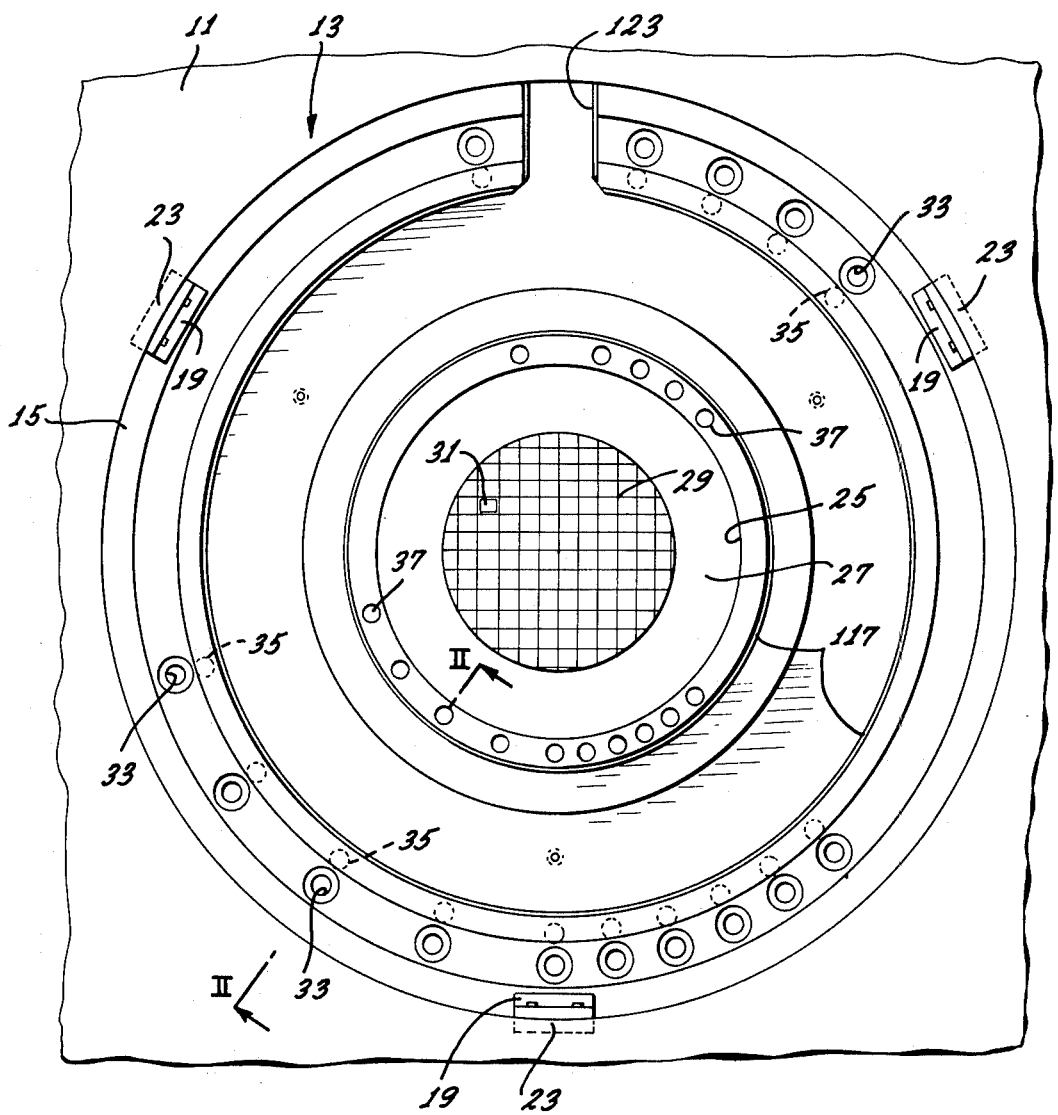
FIG. 1 comprises a top plan view of the ring member upon which probes may be mounted, and also illustrates the location of a silicone wafer to be tested, relative to the ring.

As seen in FIG. 1, a platform or casting 11, which may be formed as an integral part of or otherwise mounted on a machine in a fixed location, may be provided for supporting a ring-like member, generally illustrated at 13. If desired, the ring may be mounted in the manner shown in FIG. 2 by the provision of a flange or lip 15 seated on a shoulder 17 of the casting. A spacer 19 may then be fastened to the ring by any suitable means such as roll pins 21. A clamp 23 may be fastened to the casting 11 in any desired manner so as to extend over and enter into abutment with the upper surfaces of the spacers to prohibit movement of the ring relative to the casting.

As shown in FIG. 1, the ring 13 may be provided with a central bore 25. Situated beneath the ring and generally below the bore, although not necessarily coaxially therewith, is illustrated a worktable or platform 27 upon which is mounted a silicone wafer 29. As illustrated, the silicone wafer is formed with a grid pattern on its upper surface; the space within each grid, one of which is illustrated at 31, may be provided with a microcircuit of any desired type, formed by any suitable means.

The worktable 27 may be moved parallel to the vertically aligned columns of the wafer 29 and parallel to the horizontally aligned rows of the wafer, both as illustrated in FIG. 1, by any suitable means which are not shown. In this manner, each of the microcircuits as illustrated at 31 may be located in a suitable position relative to the axis of the ring 13 so that it may be brought into contact with a plurality of probes suspended from the ring. The worktable may also be moved vertically in order to bring the wafer in and out of horizontal alignment with the probes as each microcircuit is brought into position. The relationship of one probe with a microcircuit on the silicone wafer 29 is illustrated in FIG. 2.

Referring again to FIG. 1, it can be seen that a plurality of countersunk bores 33 may be similarly radially aligned with a blind bore 35 formed in the bottom or undersurface of the ring and a threaded bore 37 may be similarly radially aligned, adjacent the inner diameter of the ring at the bore 25.

These radially aligned bores are illustrated in various groupings, each having a distinctive angular separation between adjacent bores. In the normal case, only one angular spacing between adjacent bores would be utilized about the entire ring; the illustration merely serves to depict the fact that various angular separations may be employed, depending upon the number of probes to be employed in any given testing apparatus.

Referring now to FIG. 2, there is shown a probe arm 43 which may be suspended beneath the bottom surface of the ring 13. The probe may be held against the ring by means of a screw member 45 which is threaded into the blind bore 35. The screw 45 thus passes through an enlarged bore 47 in the probe arm 43 and a pair of crescent or other type spring washers 49 may be employed to act between the head end 51 of the screw and a washer 53. Thus, the arm 43 is biased upwardly toward the ring while the screw 45 limits but does not prohibit vertical and horizontal movement of the arm relative to the ring.

At the outer end of the arm 43, one or more nibs 55 (shown as two) may be employed to bear against the undersurface of the ring 33 to provide a stable, non-rocking arm against the ring and reduce the frictional contact therebetween. An elongated slot 61 may be formed in the upper surface of the arm 43 in order to receive the conical tip of a vertical control member 63.

The vertical control member 63 may be provided with a threaded portion 65 which cooperates with the threaded bore 37. Thus, manually turning the knurled knob 67 of the vertical control member will cause it to move axially relative to the bore 37. As the conical tip is moved into the slot 61 in the arm, the arm will be forced downwardly against the force of the spring washers 49 in an arc, the center of which is located along a line extending through the rear edges of the nibs 55. On the other hand, as the vertical control member is withdrawn, the spring washers will force the arm upwardly to a maximum limit in which the inner end of the arm contacts the lower surface of the ring 13.

The lower portion of the vertical control member 63, below its threaded section 65, may have a smooth circumference so as to cooperate with a biasing member 69 which may, for example, be formed of a small nylon plug acted upon by a coil spring 71, both elements being situated within a blind horizontal bore 73 in the ring. The plug and spring may be employed to force the vertical control member 63 to maintain a constant axial position free from play. If desired, the lower end of the vertical control member may be supported and its radial movement limited by passing it through a smooth bore 79 formed in a flange 81 extending from the lower surface of the ring. In other words, the smooth bore 79 and the threaded bore 37 may be coaxially aligned. Also, if desired, the bores 37 and 39 may be provided with slots or similar reliefs (not shown) which extend through the entirety of each bore parallel to the axis thereof such that the biasing plug 69 forces the vertical control member 63 toward both slots. Thus stability is insured.

With structure in the nature of that thus described and illustrated, it will be quickly seen by those skilled in the art that vertical movement of the arm 43 may be quickly and accurately controlled by cooperation of the bolt or screw 63 and the slot 61.

In order to control movement of the arm in a horizontal plane, a horizontal control rod 81 may extend into and through the countersunk bore 33 in the manner illustrated in FIG. 2. Adjacent the lower end of the horizontal control member, a ball or bearing 83 may be formed integral with or mounted on the rod 81 to cooperate very closely with the wall of the bore 33. In other words, the bearing will be constantly in contact with and bear against the surface of the bore 33 so that as the control member 81 is oscillated or pivoted universally about the center of the ball 83, there will be very little play between the control member and the bore. Extending from the pivot ball 83, there may be provided an actuating or drive bearing or ball 85 which cooperates with a blind bore 87 located in the upper surface of the arm 43. Again, the drive bearing 85 may be produced so as to be closely fitting with the surface of the bore 87 to prohibit excessive play therebetween. With this structure, when the control member 81 is oscillated or pivoted about the center of the bearing 83, under the limits imposed by the wall of the countersink, the drive bearing 85 will cause the arm 43 to move universally in the horizontal plane.

In use, if it is desired to pivot the arm so that its inner end moves along a Z axis, i.e., perpendicular to the radius of the ring, the control member 81 may be pivoted in a plane which is substantially tangential to the radius of the ring 13. In other words, as the upper end of the rod 81 is pulled toward the viewer of FIG. 2, the drive bearing 85 will drive the outer end of the arm 43 away from the viewer, limited only by contact of the fastening bolt 45 with the periphery of the bore 47. Since the vertical control bolt 63 is in contact with the sides of the slot 61, the vertical control member will act as the pivot point for movement of the inner end of the arm in the Z axis toward the viewer.

Figure 3:
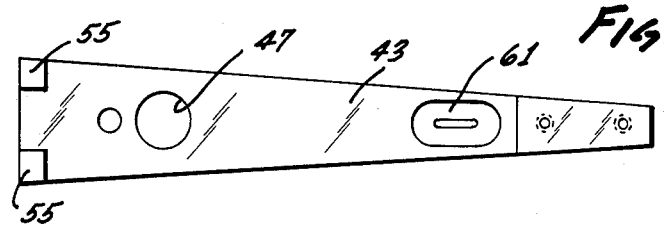
FIG. 3 comprises a top plan view of a probe arm, as seen along a line III—III of FIG. 2.

On the other hand, when it is desired to move the arm along the X axis, i.e., directly along a radius of the ring 13, the control member 81 may be moved in an arc in the plane of the paper as seen in FIG. 2, thus driving the arm in or out along the radius, again limited only by contact between the fastening bolt 45 and the bore 47. Since the slot 61 is elongated as shown in FIG. 3 along the X axis of the arm, motion along this axis will not be inhibited by contact of the slot with the vertical control member 63.

It will now be apparent to those skilled in the art that movement of the control arm 43 in the X, Y, and/or Z axis may be quickly and easily controlled by movement of either the rod 63 or the rod 81. Also, so long as the position set for either of those rods is not altered, the arm will remain in a fixed position under the biasing force exerted by the springs 49.

As shown in FIG. 2, a probe 101 may be fixed to the inner end of the probe arm 43 by any suitable fastening means such as a pair of bolts or screws 103. As will be more completely described hereafter a pair of connector pins 105 and 107 may extend from the probe so that a pair of wires 109 and 111, respectively, may be attached thereto. In turn, the wires may be attached to a pair of connectors 113 mounted in a high performance board 115. This exemplary high performance board may be seated on a pair of shoulders 117 (FIG. 1) in the ring which are formed adjacent the edges of a circumferential groove 119. A cable 121 may be seated in the groove and the connectors 113 suitably attached thereto as illustrated in FIG. 2. The cable 121 may travel along the entire length of the groove 119 so that every probe mounted on the ring 113 may be suitably connected to the cable. The cable may be lead off from the groove 119 via a radial groove 123 (FIG. 1) so that it may then be connected to the control drive circuitry.

Referring now to FIG. 4, one embodiment of a probe 101 which may be used with the present invention has been illustrated. In this embodiment, the probe has a central elongated dielectric body 133. Although not illustrated in plan view, the body 133 may become narrower as the distance from the left side of FIG. 4 increases, until forming substantially a sharp edge 135 adjacent a probe blade 137. At the opposite end of the body 133, a flange 139 may be provided having suitable apertures 141 through which the bolts 103 may be passed in order to fix the probe to the arm 43.

The probe blade 137 may be brazed, soldered, or otherwise suitably connected to a pair of flat, relatively flexible conductive elements or beams 147 and 149. In a manner similar to the plan configuration of the body 133, these elements also are substantially triangular in configuration and are substantially pointed at the end at which they are each fastened to the probe blade.

The rear ends of the beams 147 and 149 may be embedded in or otherwise to the central body 133 in such a way that the element 147 may be placed into conductive contact with the pin connector 105, while separated from such contact with the pin connector 107 by means of an aperture 153 formed large enough to allow the pin 107 to freely pass therethrough without making contact. Similarly, the pin 107 may be in contact with the element 149, while the pin 105 is prevented from contacting that element by means of an aperture 155. Thus, a circuit may be formed by means of the pin 105, beam 147, probe blade 137, beam 149, and pin connector 107.

This rather simple structure allows the achievement of a result which was completely unobtainable with the prior art devices. This result will now be clearly apparent from the drawing of FIG. 4 to those skilled in the art; the horizontal arrangement of the flexible conductive beams 147 and 149 will form a Kelvin arrangement with the probe blade 137 and will allow a tip or point 157 of the probe blade 137 to be pushed upwardly slightly after a predetermined preload in beam 149 and its structure is exceeded. The upward movement will be limited only by contact of the lower conductive element 149 with the undersurface of the body 133. At the same time, downward movement of the probe blade may be limited by contact of the upper conductive element 147 with a plateau-like flange 159 on the body 133. Thus, as a result of this flexibility of the position of the prove blade and point, it is possible for a person using the apparatus to position each probe along the Y axis within a visual tolerance limit without fear of damaging the probe or the microcircuitry intended to be tested.

In FIG. 5, a second type of probe has been illustrated which may be utilized to operate a predetermined movement of the worktable 27 to align a new column or row of microcircuits with the probes being used whenever the last circuit in a column or a row has been tested. The illustrated probe is in many respects identical to that illustrated in FIG. 4. Accordingly, those elements which are identical in configuration and function have been provided with similar reference numerals, each preceded by the number "2" rather than the number "1". Thus, for example, this probe is designated "201", having a body 233, and a blade 237, whereas the previous probe was designated "101" having a body 133, and a blade 137, etc. Accordingly, that structure which has previously been described with reference to the probe in FIG. 4 need not be described again here.

The probe 201 is distinguishable from the probe 101 in that both the conductive elements 247 and 249 are formed so as to be in contact with the pin connector 205. On the other hand, both probes are insulated from contact with the pin connector 207 by means of an aperture 253 in the element 247 and an aperture 301 in the element 249. A third conductive beam, or contact of any suitable type, 303 may be mounted and fixed to the upper surface of the body 233 and provided with an aperture 305 so as to be insulated from contact with the pin 205. On the other hand, the contact 303 may be in fixed electrical contact with the pin connector 207.

In the position illustrated in FIG. 5, it can be seen that a circuit may be formed through the pin 205, the flexible beam 247, the contact 303, and the pin or connector 207. If the probe 201 is adjusted in the Y axis so that it assumes this position whenever it is not in contact with a silicone wafer, this circuit completion may be used to instruct the worktable 27 to realign itself relative to the probes.

On the other hand, such proper positioning of the probe may be utilized to cause the point 257 to contact the silicone wafer whenever such a wafer is located beneath the probe. If the probe is positioned slightly below what might otherwise be preferred for the position of probe 101, contact of the point 257 with the silicone wafer will cause the probe blade to be pushed upwardly against the biasing forces generated by the conductive beams 247 and 249. When the beam 247 is thus pushed upwardly, it will be presented from contacting the outer end of the contact 303 above the flange 259 and the circuit will be broken. Thus, it should now be apparent that when contact exists between the wafer 29 and the blade 237, there will be no circuit signal for reorientation of the worktable. On the other hand, when the silicone wafer does not push the blade 237 upwardly, such a signal will exist.

Consequently, both the probes 101 and 201 may be used and mounted on probe arms 43 in the manner illustrated in FIG. 2 to accomplish the desired results. If desired, an inking device 307 may also be mounted on an arm 43 by means of the bolts 103, so as to position an inking point 309 immediately above the point of the probe. Such an inking device may be used for any number of purposes, such as marking a defective microcircuit, etc.

It is now clear that the above-recited objectives and advantages desired for test apparatus of this nature are clearly available and inherent in this invention, both in the abovedescribed structure and in a wide variety of distinctive structures and embodiments which will employ the invention without exceeding the scope thereof. Accordingly, it will also be realized by those skilled in the art that the above description is merely an illustration of the preferred embodiment of the invention and does not, per se, define the limits thereof.

I claim:
1. A device for testing printed circuitry comprising support means,
electrical connection means mounted on said support means,
a probe arm supported by said support means for movement in a particular plane relative to said support means,
at least one test probe mounted on said probe arm having
means thereon for contacting the printed circuitry for transmitting a current therethrough and
conductor means interconnecting said electrical connection means and said circuitry contact means, and
apparatus for selectively positioning said probe relative to said supporting means including
first means for selectively moving said probe arm in substantially a single line of motion along a first axis transverse to the printed circuitry being tested and
second means for selectively moving said probe arm substantially universally in the particular plane substantially parallel to said printed circuitry,
the first means including third means on the probe arm near one end of the probe arm and extending through the support means and engaging the probe arm for providing a fulcrum for rotary movement of the probe arm relative to the support means in the particular plane and for providing an adjustment of the probe arm relative to the support means along the first axis and the second means including fourth means extending through the support means to the probe arm and operable to provide a movement of the probe arm in the particular plane relative to the support means in accordance with such operation and the first means further including fifth means operatively coupled to the support means and the probe arm at a position between the third means and the fourth means to bias the probe arm toward the support means and to control the disposition of the third means relative to the probe arm along the first axis.

2. The apparatus of claim 1 wherein means are provided to impose a binding force on the fourth means in a direction substantially parallel to the first plane to insure that the movement of the fourth means occurs only in the first direction.

3. In combination for providing a controlled movement of a probe relative to a microcircuitry means in a particular plane defined by X and Z axes and along a Y axis substantially perpendicular to the particular plane,
   support means,
   a probe arm for carrying the probe, the probe arm being disposed in abutting relationship to the support means for movement relative to the support means in the particular plane,
   operable means extending between the support means and the probe arm and actuatable to provide a linear movement of the probe arm reltive to the support means along the X axis and to provide an arcuate movement of the probe arm relative to the support means along substantially the Z axis,
   control means adjustably coupled to the support means and the probe arm for providing on a controlled basis for the movement of the probe relative to the support means along the Y axis in accordance with the adjustment of the control means for providing the fulcrum for the arcuate movement of the probe arm relative to the support means along substantially the Z axis, and
   holding means disposed between the operable means and the control means and coupled to the support means and the probe arm for maintaining the probe arm in contiguous relationship to the support means and for providing the adjustments of the probe arm relative to the support means along the Y axis in accordance with the adjustment of the control means, the holding means being constructed to provide for movements of the probe arm relative to the support means along the X axis and along substantially the Z axis.

4. The combination set forth in claim 3 wherein the operable means extends through the support means and engages the probe arm for the arcuate and linear movements of the probe arm in accordance with the operation of the operable means and wherein the holding means include means for adjusting the pressure exerted by the holding means against the probe arm and the support means to position the probe arm in the Y direction relative to the support means in accordance with the adjustments of the control means.

5. The combination set forth in claim 4 wherein the control means as a point engaging the probe arm and the operable means includes a manually engageable control rod pivotable to produce the movements of the probe arm relative to the support means in the arcuate and linear directions.

6. The combination set forth in claim 5 wherein the control rod in the operable means extends through the support means and engages the probe arm and is manually engageable for pivotable movement about a fulcrum on the support means relative to the position of engagement with the probe arm to move the probe arm in the arcuate direction and in the linear direction relative to the support means.

7. The combination set forth in claim 6 wherein the control rod has a ball at the end engaging the probe arm and the probe arm has a bore for receiving the ball to faciitate the pivotal dispositon of the control rod relative to the probe arm and one of the support means and the probe arm has a nib engaging the other one of the support means and the probe arm at a position on the opposite side of the operating means from the holding means to provide a fulcrum for the pivotal movement of the probe arm relative to the support means in the Y direction.

8. The combination set forth in claim 3 wherein the holding means includes a member extending through the probe arm and threadedly engaging the support means and wherein the probe arm has an enlarged bore for receiving the threaded member and for providing for the pivotal and axial movements of the probe arm relative to the support means.

9. In combination for testing electrical microcircuitry,
   a probe arm,
   at least one probe carried by the probe arm,
   support means disposed in a planar relationship to the probe arm and in contiguous relationship to the probe arm along this place,
   operable means operatively coupled to the support means and the probe arm for coupling the support means and the probe arm to provide for a linear displacement of the probe arm relative to the support means in the planar relationship along a first axis and an arcuate displacement of the probe arm relative to the support means in the planar relationship along substantially a second axis transverse to the first axis in accordance with the operation of the operable means,
   holding means displaced from the operable means along the first axis for maintaining the support means and the probe arm contiguous to each other in the planar relationship, and
   control means displaced along the first axis from the holding means and further displaced along the first axis from the operable means and extending through the support means into operative relationship with the probe arm for providing on a controlled basis for the linear displacement of the probe arm relative to the support means along the first axis and for the arcuate displacement of the probe arm relative to the support means along substantially the second axis about the control means as a fulcrum in accordance with the operation of the operable means, the control means being adjustable to provide for an adjustment in the relative disposition of the support means and the probe arm along substantially an axis perpendicular to the planar relationship.

10. The combination set forth in claim 9 wherein the probe arm has nibs extending to the support means at particular positions to engage the support means at such particular positions and maintain a spaced relationship between the probe arm and the support means at other positions and to provide a fulcrum for pivotal adjustment by the control means of the probe arm relative to the support means along the axis substantially perpendicular to the planar direction and wherein the nibs are on the opposite side of the operable means from the holding means.

11. The combination set forth in claim 9 wherein the operable means includes a manually actuatable control rod engaging the probe arm for pivotal movement relative to the probe arm upon manual actuation and wherein the probe arm is movable substantially along the first and second axes in accordance with the manual actuation of the control rod and wherein the holding means are adjustable to control the force exerted by the probe arm on the control means in the operative relationship.

12. The combination set forth in claim 11 wherein the control rod has a ball engaging the probe arm and wherein the ball cooperates with a blind bore in the probe arm to provide for the pivotal movement of the control rod to the probe arm in accordance with the manual actuation of the control rod and wherein the control means has a point in contact with the probe arm.

13. The combination set forth in claim 9 wherein the control means has a threaded portion which extends to the probe arm through a threaded portion in the support means to provide for an adjustable positioning of the control means relative to the probe arm along substantially the axis perpendicular to the planar relationship between the probe arm and the support means and wherein resilient means extend from the support means to the control means to maintain the control means in fixed positioning relative to the probe arm after adjustment in the positioning of the control means.

14. The combination set forth in claim 8 wherein means are disposed in cooperative relationship with the support means and the probe arm for maintaining the control means in a fixed relationship to the probe arm in the substantially perpendicular direction after an adjustable positioning of the control means.

15. The combination set forth in claim 9 wherein the control means is constructed to provide a point contact with the probe arm and wherein the operable means is manually pivotable about a position in the support means as a fulcrum to provide for the linear displacement of the point contact along the first axis and the arcuate displacement of the probe arm relative to the support means along substantially the second axis about the point contact as a fulcrum.

16. The combination set forth in claim 10 wherein the holding means includes a threaded member extending to the probe arm in threaded relationship with the support means to provide for adjustments in force exerted along substantially the perpendicular axis between the holding means and the probe arm about the nibs as a fulcrum and wherein the probe arm is provided with an enlarged bore for receiving the threaded member to provide for controlled movements of the probe arm relative to the support means along substantially the first and second axes and wherein resilient means are disposed on the threaded member to control the force exerted in the substantially perpendicular direction between the holding means and the probe arm.

17. In combination for testing electrical microcircuitry,
a probe arm movable in a particular plane,
at least one probe carried by the probe arm for testing the electrical microcircuitry,
support means disposed in contiguous relationship to the probe arm in the particular plane,
operable means extending through the support means, in adjustable relationship to the support means, along substantially a first axis transverse to the particular plane, the operable means engaging the probe arm and being operable to provide for an arcuate displacement of the probe arm in the particular plane about a particular position on the support means as a fulcrum and to provide for a linear displacement of the probe arm relative to the support means in the particular plane along a second axis transverse to the arcuate movement,
control means displaced substantially along the second axis from the operable means and extending through the support means into engagement with the probe arm in a relationship to provide for the arcuate displacement of the probe arm relative to the support means in the particular plane about the control means as a fulcrum and to provide for the linear displacement of the probe arm relative to the support means along the second axis, the control means being adjustable to vary the positioning between the probe arm and the support means along substantially the first axis, and
holding means disposed between the operable means and the control means along the second axis and operatively coupled to the support means and the probe arm for maintaining the probe arm and the support means in the contiguous relationship and for providing for the adjustment of the probe arm relative to the support means along the first axis.

18. The combination set forth in claim 17 wherein the holding means extends through a bore in the probe arm and the bore is enlarged to provide for the arcuate and linear displacements of the probe arm relative to the support means in the particular plane and wherein the holding means is adjustable relative to the support means and wherein resilient means are disposed on the holding means for controlling the force exerted by the holding means on the probe arm.

19. The combination set forth in claim 17 wherein the control means extends through the support means to the probe arm in a threaded relationship with the support means for adjustment of the pressure between the support means and the probe arm and wherein the control means has a point contact engaging the probe arm in accordance with the adjustments in the pressure between the support means and the probe arm and wherein the holding means are provided for exerting a force on the control means to maintain the control means in a particular pressure relationship between the probe arm and the support means.

20. The combination set forth in claim 19 wherein the operable means includes a control rod extending through the support means for pivotable operation relative to the support means about a point in the support means as a fulcrum and the control rod engages the probe arm for adjustable pivotable disposition relative to the probe arm in accordance with the operation of the control rod and wherein means are provided at the end of the control rod to produce the linear and arcuate movements of the probe arm relative to the support means in accordance with the pivotal operation of the control rod.

21. The combination set forth in claim 20 wherein the probe arm has a nib engaging the support means at a position displaced along the second axis from the operable means and further displaced along the second axis from the holding means to provide a fulcrum for adjustment of the probe arm relative to the support means along substantially the first axis.

22. A device for testing printed circuitry comprising support means,
electrical connection means mounted on said support means,
a probe arm supported by said support means for movement in the particular plane relative to said support means,
at least one test probe mounted on said probe arm having
means thereon for contacting the printed circuitry for transmitting a current therethrough and
conductor means interconnecting said electrical connection means and said circuitry contact means, and
apparatus for selectively positioning said probe relative to said supporting means including
first means for selectively moving said probe arm along substantially a first axis transverse to the printed circuitry being tested and
second means for selectively moving said probe arm substantially universally in the particular plane substantially parallel to said printed circuitry,
the first means including third means on the probe arm near one end of the probe arm and extending through the support means to the probe arm and constructed and disposed to provide an adjustment of the probe arm relative to the support means along substantially the first axis and further including fourth means extending through the support means to the probe arm and operable to provide a movement of the probe arm in the particular plane relative to the support means in accordance with such operation and further including fifth means operatively coupled to the support means and the probe arm at a position between the third means and the fourth means to bias the probe arm along substantially the first axis toward the support means, said conductor means including
a pair of flexible conductive members arranged so as to be substantially perpendicular to said contacting means and
said contacting means comprising
a substantially flat blade having a point thereof for suitably contacting a circuit to be tested and
means for electrically bonding said blade to said pair of conductive members and
said conductor means including a pair of conductive pins each making electrical contact with an individual one of the flexible conductive members.

* * * * *